United States Patent

Smith et al.

[11] Patent Number: 5,417,934
[45] Date of Patent: May 23, 1995

[54] DRY EXHAUST GAS CONDITIONING

[75] Inventors: James R. Smith, Somerset; Peter L. Timms, Bristol, both of United Kingdom

[73] Assignee: BOC Limited, Windlesham, England

[21] Appl. No.: 8,936

[22] Filed: Jan. 26, 1993

Related U.S. Application Data

[63] Continuation-in-part of Ser. No. 613,572, Dec. 3, 1990, Pat. No. 5,213,767.

[30] Foreign Application Priority Data

Jun. 4, 1988 [GB] United Kingdom ............... 8813270

[51] Int. Cl.⁶ .................. B01D 53/00; B01D 53/34
[52] U.S. Cl. .................... 422/177; 422/171; 423/210; 423/240 S; 423/241
[58] Field of Search ............. 422/171, 170, 173, 174, 422/177; 423/210, 240 S, 241; 427/585, 588, 444; 437/222, 241, 242

[56] References Cited

U.S. PATENT DOCUMENTS

| | | | |
|---|---|---|---|
| 4,108,505 | 3/1992 | Cathey, Jr. ............... | 156/643 |
| 4,629,611 | 12/1986 | Fan ........................ | 423/240 S |
| 4,753,818 | 6/1988 | Rogers, Jr. ............... | 427/54.1 |
| 4,977,106 | 12/1990 | Smith ...................... | 437/192 |
| 5,112,439 | 5/1992 | Reisman et al. ........... | 156/656 |
| 5,164,330 | 11/1992 | Davis et al. .............. | 437/192 |
| 5,212,118 | 5/1993 | Saxena .................... | 437/235 |

FOREIGN PATENT DOCUMENTS

| | | | |
|---|---|---|---|
| 0194366 | 3/1985 | European Pat. Off. ........ | 423/240 S |
| 1101231 | 5/1986 | Japan ...................... | 423/240 S |
| 0204025 | 9/1986 | Japan ...................... | 423/240 S |
| 2152519 | 7/1987 | Japan ...................... | 423/240 S |
| 0990273 | 1/1983 | U.S.S.R. ................... | 423/240 S |

*Primary Examiner*—Robert J. Warden
*Assistant Examiner*—Christopher Y. Kim
*Attorney, Agent, or Firm*—David M. Rosenblum; Larry R. Cassett

[57] ABSTRACT

A gas treatment method and apparatus for use in connection with processes of etching semiconductor devices or of plasma enhanced chemical vapor deposition onto semiconductor materials. In accordance with the method and apparatus, the exhaust gases are introduced into first and second stages while heating the first and second stages. The stages can be contained within a heated cartridge. The first stage contains silicon or a silicon-rich alloy or a silicon-rich substance in a particulate form and a partial coating of copper or a copper rich substance in intimate contact with the silicon, the silicon-rich alloy or the silicon-rich substance. The second stage contains calcium oxide, a calcium oxide containing material, or a soda lime containing medium.

4 Claims, 3 Drawing Sheets

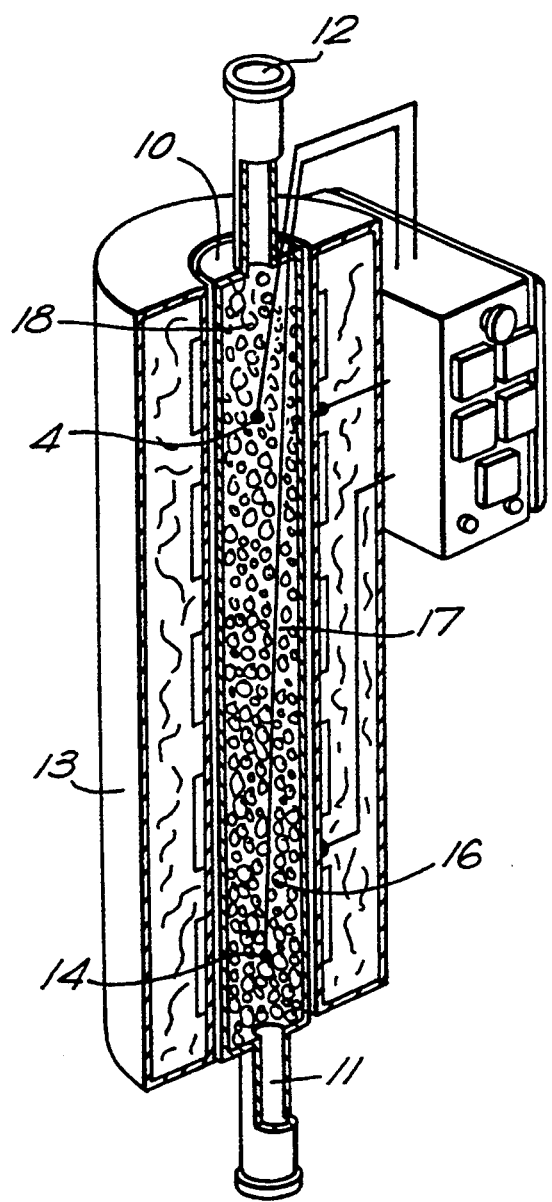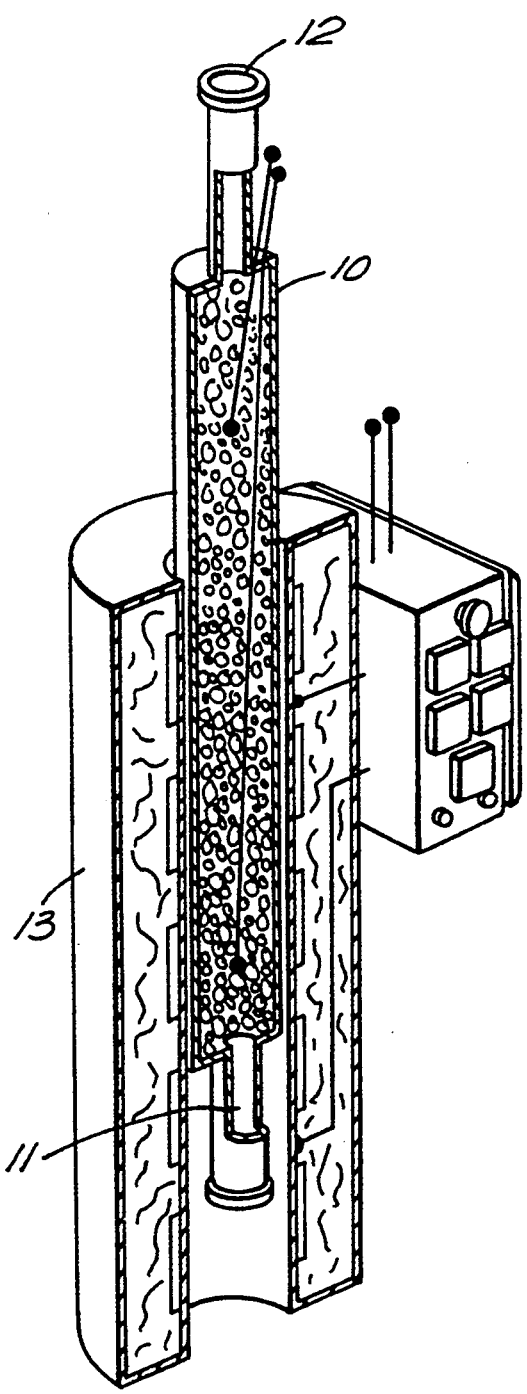
FIG.1.
FIG.2.

DRY EXHAUST GAS CONDITIONING

RELATED APPLICATIONS

This is a continuation-in-part of application Ser. No. 07/613,572, filed Dec. 3, 1990, U.S. Pat. No. 5,213,767.

BACKGROUND OF THE INVENTION

The purpose of the invention is to convert certain hazardous gaseous effluents by chemical reactions into safer solid or gaseous products. Preferably the chemical reagents used are solids and hence reduce the risk of carry-over contamination from the gas conditioning equipment. The solid chemical reagents used are easier and safer to handle than liquid reagents. The solid reagents lend themselves readily to encapsulation in exchangeable cartridges.

The gaseous effluents can be the gases that come from etching of semi-conductor devices or from PECVD (Plasma Enhanced Chemical Vapour Deposition) on to semi-conductor materials: similar gases and vapors are used in several stages of manufacture in the semi-conductor manufacturing process. The effluent gases (and vapors) from reactive ion etching and plasma etching include chlorine, silicon tetrachloride, copper chloride (CuCl), aluminium chlorides (i.e. $AlCl_3$), silicon tetrafluoride, trifluoromethane ($CHF_3$), carbonyl fluoride ($COF_2$), carbonyl chloride ($COCl_2$), boron trichloride ($BCl_3$), boron tribromide ($BBr_3$), hydrogen chloride (HCl), carbon tetrachloride ($CCl_4$), chlorofluoro carbon gases and others.

Additional gases and vapors that are sometimes found in the effluent of PECVD operations include silane ($SiH_4$), dichlorosilane ($SiCl_2H_2$), tetraethylorthosilicate ($Si(OC_2H_5)_4$), diborane ($B_2H_6$), trimethyl borate ($B(OCH_3)_3$), phosphine ($PH_3$), trimethylphosphite ($P(OCH_3)_3$), arsine ($ASH_3$) and others.

The current practice is to allow these gases/vapors to enter an exhaust duct to be transported to a wet scrubber positioned at the exhaust end of the lines. This method is occasionally supplemented by local placement of scrubbers. For etching these may be either:

(a) Of the activated charcoal type to trap the acid gases. This method can trap up to 15% of its charcoal weight of $Cl_2$. The product is charcoal with the effluent gases trapped but not converted to safer products and some of these effluent gases will be liberated if the charcoal is burnt.

(b) Of the wet type; there are several designs of wet scrubber, most using either a Venturi stage or a packed tower or a combination of both. These designs have been used for larger applications: when placed local to the source of the contamination they present the danger of contamination of the process chamber with their aqueous solutions of caustic type media. The contamination can result from a back streaming type of mechanism or from a massive suckback.

(c) The chemical filter type utilizing a combination of adsorption and chemical adsorption. These are expensive and do not have a good capacity per unit volume.

PECVD scrubbers can be as above but often have a Burn box gas conditioning unit introduced locally. These units burn the effluent gases to form their oxides and water vapor. They suffer from blockage problems and there are normally large volumes of oxides to contend with.

SUMMARY OF THE INVENTION

The chemical exhaust gas conditioning unit of this invention operates in two main sections and an optional third section. The effluent gases pass first through a section in which the active chemical component is elemental silicon. Second, through a section in which the active component is lime, or soda lime (calcium oxide or calcium hydroxide). Third, and optionally, through a section in which the active components are lime and copper oxides (CuO or $Cu_2O$). These sections can be housed in a single container (FIG. 1) or compartmentalized in different containers (FIG. 2) so that the gases can flow from one to the next. Alternatively the sections can be combined, the silicon mixed with the lime/soda lime in a single reactor.

Broadly stated, from one aspect the invention consists in apparatus for treatment of exhaust gases, comprising means for exposing the gases to silicon, or a silicon-rich alloy or substance, and means for then exposing the gases to calcium oxide or a calcium oxide compound or calcium oxide containing material, or a soda lime containing medium.

In a preferred embodiment the apparatus comprises a first (silicon) stage, and a second (calcium oxide) stage arranged in sequence and conveniently a single gas treatment chamber may have in series silicon and calcium oxide containing zones.

In the first stage, the silicon should have a purity greater than 90% but preferably greater than 97%. It can be mixed with "inert" substance such as silica or alumina or even with lime (CaO) or magnesia (MgO). It can also, though with increased problems, be alloyed with any of the metals Cr, Mn, Fe, Co or Ni, of which ferrosilicon or manganese-silicon are cheap examples. Silicon carbide, which is significantly less reactive but behaves more slowly in a similar way to silicon, is also possible. This silicon stage may be heated to a temperature above 200° C. and preferably between 350° C. and 550° C.

In an alternative embodiment copper or a copper-rich material may be added to the first stage to promote the scrubbing of $NF_3$ from nitrogen-rich exhaust streams. The copper promotes the formation of $N_2F_4$ which will react more readily in the second stage.

In the case of such copper additions to the first stage, either for the scrubbing of $NF_3$ from gas streams, especially nitrogen rich exhaust streams or for the scrubbing of other gases generally, it has been found that the copper can simply be mixed with the silicon.

However, in preferred embodiments, the first stage comprises silicon particles which have been partially coated with copper. In particular, it is advantageous that i) the silicon is not completely coated with the copper to ensure that the copper does not completely passivate the silicon in that both the silicon and the copper play an important role in the reactions in which $NF_3$ in particular is eliminated from the gas stream as it passes through the exhaust gas conditioning unit;

ii) the silicon and the copper are in intimate physical contact over at least part of the surface areas of the respective particles.

Preferably the silicon is coated with the copper by coating the silicon particles with a solution of a copper compound which can subsequently be decomposed (or otherwise reacted) to form substantially elemental copper on the surface of the silicon, preferably in an inert or a reducing atmosphere, thereby preventing the formation of copper oxide.

The copper compound can be, for example, copper oxilate contained in a suitable solution, for example, a lactose solution, in which the silicon particles can be immersed and coated with the solution; the oxilate can then be decomposed by heating at say 300°–500° C., preferably in a nitrogen (or other inert or reducing) atmosphere.

With regard to the reaction mechanisms, it is known that $NF_3$ reacts readily with copper to form nitrogen fluoride ($N_2F_4$) but that the formation of copper fluoride ($CuF_2$) inhibits this reaction. This aspect of the invention is based on the surprising discovery that partial coating of the silicon particles with copper would allow the $NF_3/Cu$ reaction to proceed as above but thereafter to allow a) the resulting copper fluoride to react with the silicon to produce elemental copper and silicon fluoride ($SiF_4$); and b) the resulting nitrogen fluoride ($N_2F_4$)—a much more reactive gas than $NF_3$—to react readily with silicon, even at relatively lower temperatures.

In this forgoing aspect of the present invention, a gas treatment method is provided for use in connection with processes of etching semiconductor devices or of plasma enhanced chemical vapor deposition onto semiconductor materials. The method comprises introducing exhaust gases of the processes into the first and second stages while heating the first and second stages. The first stage contains a first active chemical component comprising a particulate form and a partial coating in intimate contact with the particulate form. The particulate form is silicon or a silicon-rich alloy or a silicon-rich substance and the partial coating is copper or a copper rich substance. The second stage contains a second active chemical component as described herein for the second stage, for instance, calcium oxide, a calcium oxide containing material, or a soda lime containing medium. Additionally, the present invention also provides a gas treatment apparatus suitable for use in treating exhaust gases produced from etching semiconductor devices and plasma enhanced chemical vapor deposition onto semiconductor materials. The apparatus comprises a means for introducing the exhaust gases into first and second stages and the first and second stages contain the first and second active chemical components as described above. The apparatus also comprises a means for heating the first and second stages.

In the second stage, the calcium oxide may be in the form of lime. This can be CaO or CaO mixed with "inert" materials such as graphite (or coke), limestone ($CaCo_3$) or magnesia ($MgCO_3$). It could also be slaked lime ($Ca(OH)_2$), which would give a more fuming product with $SiCl_4$ but would be fine for hydrides (i.e. silane diborane phosphine or arsine), or even $CaCo_3$, kept at a slightly higher temperature so that it is beginning to decompose to CaO, or dolomite ($CaCO_3MgCo_3$). The temperature of this stage may be above 100° C. and preferably between 250° C. and 550° C.

Further purification may be provided in a third stage using copper oxide (CuO or $Cu_2O$) as the active ingredient, and this may be supported on calcium silicate or (calcium oxide plus calcium silicate).

BRIEF DESCRIPTION OF THE DRAWINGS

The invention also resides in a method of treating exhaust gases, particularly but not exclusively the exhaust gases from plasma etching, reactive ion etching and PECVD operations, in which the gases are exposed first to silicon, or a silicon-rich alloy or substance, and then exposed to calcium oxide or a calcium oxide containing mixture or material whereby chlorine or chlorine compounds in the exhaust gases are first converted into silicon tetrahalide compounds which are then converted into involatile calcium silicates and calcium halide compounds leaving the gases substantially free of chlorine or other halogen containing gases.

The invention may be performed in various ways and one specific embodiment with a number of modifications will now be described by way of examples with reference to the accompanying drawings, in which:

FIG. 1 is a diagrammatic sectional view through one form of exhaust gas conditioning unit or reactor column according to the invention;

FIG. 2 illustrates the withdrawal of the cartridge unit of the reactor column of FIG. 1;

DETAILED DESCRIPTION

Figure 3:
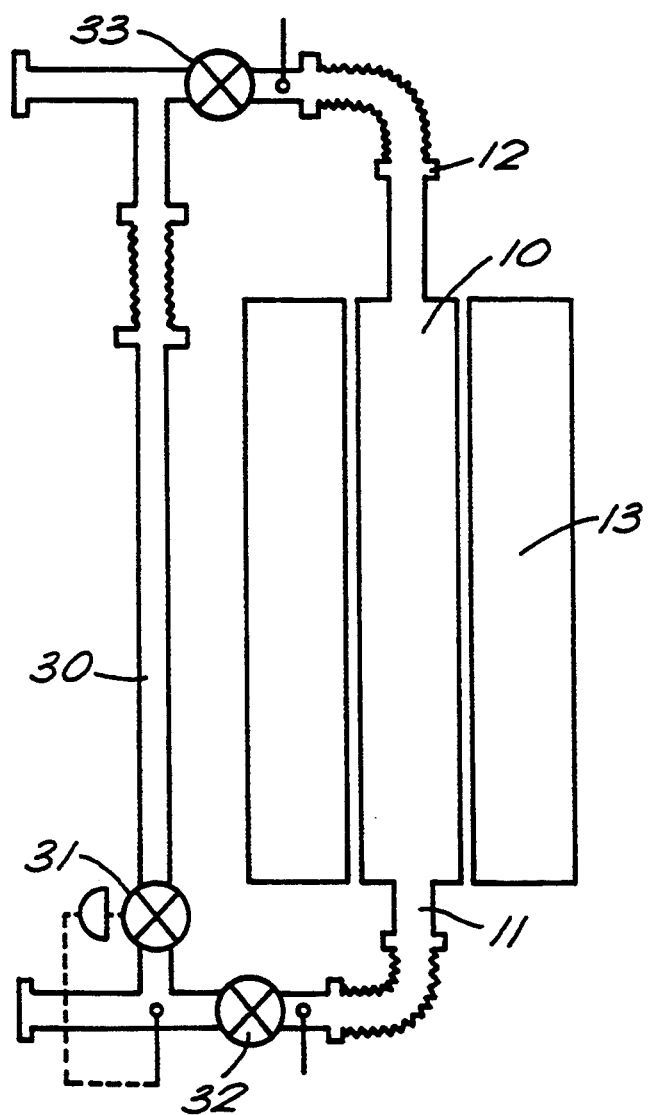
FIG. 3 is a diagrammatic illustration of a piping system including the reactor column of FIG. 1.

In the illustrated example of FIG. 1 the unit comprises a common vertical cylinder or column 10, which is in the form of a removable cartridge, having an exhaust gas inlet 11 at the lower end and an outlet 12 at the top. The column is surrounded by an electrically heated furnace 13 and there may be a spaced control thermocouples 14 at different levels. The column is divided into three sections within the same common cylinder. The bottom section 16 contains silicon, the center section 17 contains lime, and the top section 18 contains copper oxide.

The First Stage (Silicon). The effluent gases first pass through a bed of granular silicon at an elevated temperature. The silicon quantitatively converts chlorine into silicon tetra chloride and the halogen in carbon/halogen compounds into the corresponding silicon tetrahalide. The hot silicon also causes complete or partial breakdown of another of the effluent gases including silane, diborane, borane, phosphine, arsine and ammonia into hydrogen (which passes through the silicon section) and other elements which will be wholly or partially retained by the silicon.

The silicon used is most economically a metallurgical grade of crystalline or poly-crystalline material with a purity of approximately 98.5%. Higher purity silicon can be used effectively. It is also possible to use silicon-iron alloys known as "ferrosilicon" in place of or mixed with silicon: this increases the ability of the system to retain boron, phosphorous or arsenic, but gas transport of slightly volatile iron halides from the silicon section can cause blocking of gas pipes.

The silicon used should be in the form of granules or lumps, graded in size depending on the expected gas flow through the system. Lumps passing a 100 mm mesh sieve and retained by a 20 mm mesh sieve are ideal for giving very low impedance with high gas velocities, whereas granules, say passing a 15 mm mesh sieve and retained by a 3 mm mesh sieve also work, but with a higher flow impedance. Powdered silicon is undesirable as it may catch fire in an oxygen-rich effluent stream. Additionally, as discussed, the silicon can be partially coated with copper with the copper in intimate contact with the silicon.

The silicon should be heated in the temperature range 200°–700° C. with the preferred temperature 350°–550° C. The silicon can be contained in any suitable container, e.g., stainless steel, mild steel, graphite, ceramic or quartz, and heat supplied through the walls as shown in the drawings, or alternatively by induction heating or by an internally placed heat source.

The Second Stage (Lime/Soda Lime). The hot gases/vapors emerging from the silicon stage then pass through a bed of hot granulated lime. This converts silicon tetrahalides into a calcium silicate and a calcium dihalide in an exothermic reaction. It also converts boron trihalides into calcium borate and calcium dihalides and decomposes tetraethylorthosilicate vapour into calcium silicate and diethyl ether, and residual silane or borane are converted into a mixture of hydrogen and calcium silicante and silicon or calcium borate and boron.

The lime needs to be soft permeable structure strong enough to support the weight of the column without crushing to powder. The lime must be kept free of water vapor during storage and may be of a similar size to that described in the silicon section above.

The lime section needs to be maintained at an elevated temperature. A temperature in the region of 100°–600° C. would be suitable with a preferred range of 250°–550° C.

In order to promote the maximum utilization of the lime lumps it is desirable occasionally to cycle the lime temperature widely in order to promote cracking of the surface and the subsequent exposure of the underlying layers. A temperature fluctuation from 100° C. to 400° C. is suitable to promote this thermal cracking.

(Optional) The Third Stage (Copper oxide silica and lime). This stage will be required for some PECVD applications or for applications having similar exhaust gas emissions. The gases and vapors emerging from the second stage will enter the third stage. The effluent gases/vapors present are residual phosphine arsine, elemental phosphorous and arsenic. These substances react with the copper oxide-rich reagent present to form copper phosphate or arsenate and water vapor. In addition carbon monoxide is converted to carbon dioxide and hydrogen will reduce the copper oxide to copper and water.

The reagent (a mixture of copper oxide silica and lime) must first be prepared in a suitable form to be loaded into the reaction vessel. The requirement is to provide a pellet that is porous, of a size to allow the free passage of gas, and strong enough to maintain its integrity within the column. The copper oxide-rich section is maintained at an elevated temperature within the range 150°–600° C. with an optimum temperature range of 200°–400° C.

The emission gases are normally well diluted with an inert gas like nitrogen. This nitrogen gas is introduced in the final stages of the pumping stack to "ballast" the pump. In addition it is normal to use dilute reagent gas sources. Hence, the concentrations of hydrogen in nitrogen will be well below 10%. This gas concentration known as forming gas is non-flammable, and hence presents no fire hazard.

FIG. 3 illustrates a possible piping system allowing by-passing of the column 10 during cartridge replacement. This is achieved by by-pass pipe 30, by-pass valve 31 and column isolation valves 32, 33. Valve 31 may operate automatically in the event of a significant pressure build up purge and sampling ports 34, 35 are provided.

Figure 4:
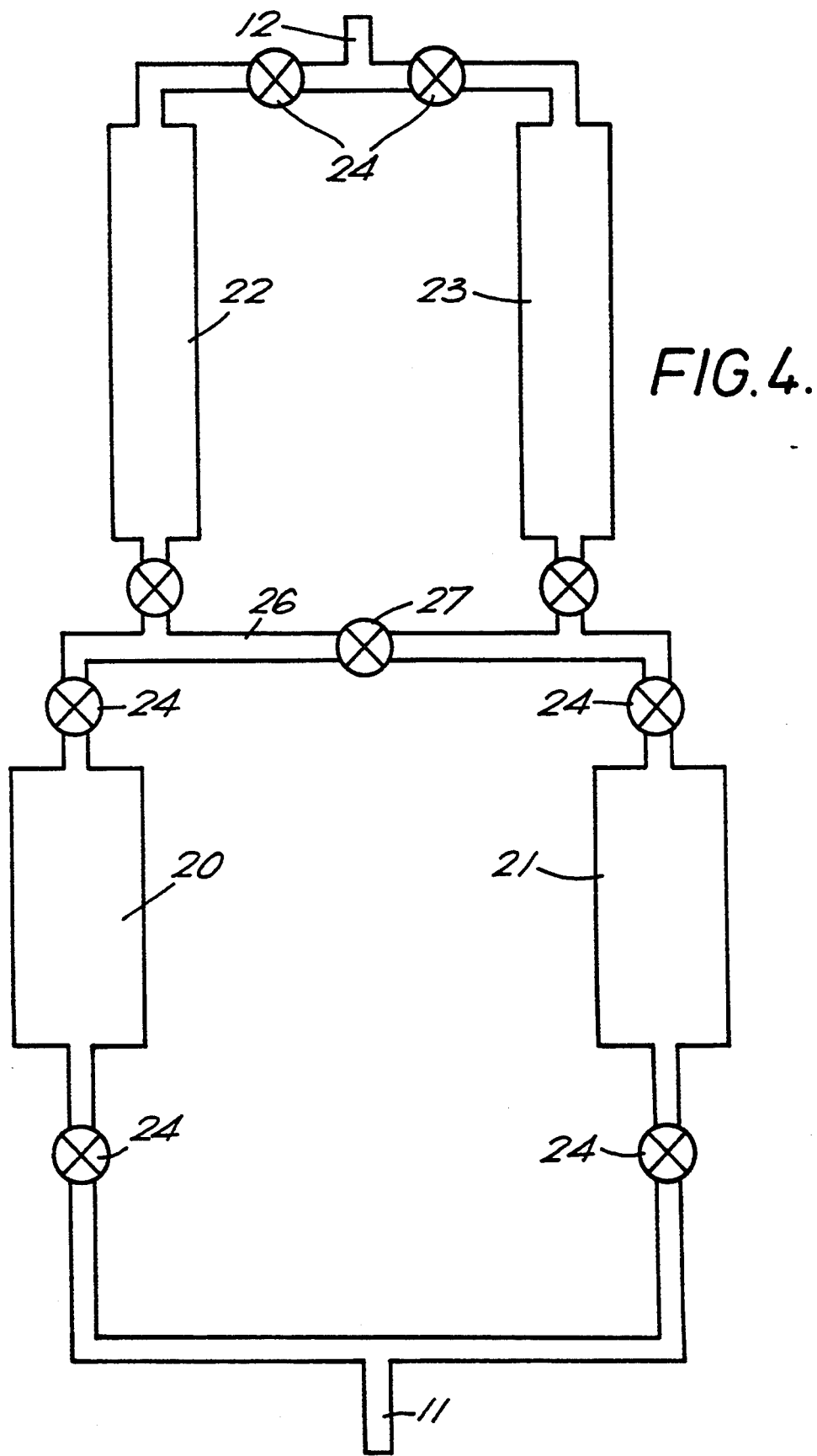
FIG. 4 is a diagrammatic illustration of a dual conditioning system.

FIG. 4 illustrates a dual system in which there are two separate silicon stages 20, 21 positioned in parallel and two separate lime stages 22, 23 also in parallel. Valves 24 are provided to control the flow in and out of the different stages and there is also a cross-communicating passage 26 controlled by valves 27 which allows gases from one side of the system to be transferred to the other side. This may be useful in a system in which the silicon and calcium oxide stages are separate, allowing for a continuous flow to be maintained.

Tests were conducted on reactor columns for inclusion in the apparatus/processes of the invention having copper additions to the silicon first stage in which the separate of $NF_3$ from nitrogen streams in particular were recorded.

The reactor column used in these tests comprised an outer stainless steel casing having a first stage of silicon/copper prepared as described below and an upper second stage of lime, each stage being substantially equal in size within the casing.

Means were provided to pass a stream of nitrogen through the reactor column from a nitrogen cylinder and via a pressure regulator to the base of the reactor column. Separate means were provided to pass a quantity of $NF_3$ gas from a cylinder and via a pressure regulator and a mass flow controller and into the nitrogen stream at the base of the reactor.

The reactor itself was surrounded by a hollow cylindrical heater incorporating electrical resistance heater means and the area inside the reactor column 1 at the interface between the first and second stages was equipped firstly with a thermometer in the form of a thermocouple and secondly with a probe of a mass spectrometer.

The reactor column Si/Cu first stage was formed by adding copper oxilate to a solution of lactose to form a creamy paste. Silicon granules were mixed with the paste and stirred to coat the silicon with the paste and the mixture left to dry. The coated silicon was thereafter loaded into the lower half of the reactor column and heated at 500° C. for about 8–12 hours in a nitrogen atmosphere. This resulted in a partial coating of the silicon granules with elemental copper. The reactor column lime second stage was then added within the stainless steel outer coating.

In use of the column, nitrogen at a flow rate of 100 standard l/hr was passed through the column for several hours to stabilize the system.

The mass spectrometer was set to monitor, inter alia, the $NF_3^+/NF_2^+$ species to establish whether $NF_3$ remained in the column at the top of the silicon/copper first stage.

Various tests were then conducted by passing a $N_2/NF_3$ gas mixture through the column at the rate of 25 standard $cm^3$/min $NF_3$ in 1.6 standard l/min $N_2$ at different temperatures including ambient temperature.

These tests showed that $NF_3$ (by virtue of the presence or otherwise of $NF_3^+/NF_2^+$ peaks) was not present at ambient temperatures but that at temperatures above 200° C. its presence was substantially reduced.

Preferably the operating temperature of the first stage of the reactor column exceeds 230° C. which generally was shown to provide a 99.9% removal of $NF_3$ from the nitrogen stream. Most preferably the operating temperature of the first stage is at least 375° C., more advantageously 400° C. or more, for all traces of $NF_3$ to be removed from the reactor column.

As will be known soda lime is normally calcium hydroxide with sodium hydroxide. Reference in this specification to soda lime should also include a mixture of calcium hydroxide and potassium hydroxide.

We claim:

1. A gas treatment method for treating exhaust gases produced from processes of etching semiconductor devices or of plasma enhanced chemical vapor deposition onto semiconductor materials, the gas treatment method comprising introducing exhaust gases of the processes into first and second stages while heating the first and second stages, the first stage containing a first active chemical component comprising a particulate form and a partial coating located on the particulate form, wherein the particulate form is silicon or a material containing silicon in elemental form and wherein the partial coating is copper or a copper containing substance and the second stage containing a second active chemical component wherein the second active chemical is calcium oxide, a calcium oxide containing material, or a soda lime containing medium.

2. The method of claim 1, wherein the exhaust gases contain at least nitrogen trifluoride.

3. An apparatus for treating exhaust gases produced from etching semiconductor devices and plasma enhanced chemical vapor deposition onto semiconductor materials, said apparatus comprising: means for introducing the exhaust gases into first and second stages, the first stage containing a first active chemical component comprising a particulate form and a partial coating located on the particulate form, wherein the particulate form is silicon or a material containing silicon in elemental form and wherein the partial coating is copper or a copper containing substance and the second stage containing a second active chemical component, wherein the second active chemical component is calcium oxide, a calcium oxide containing material, or a soda lime containing medium; and means for heating the first and second stages.

4. The apparatus of claim 3, in which the first active component comprises the silicon or the material containing the silicon in the particulate form coated with a subsequently decomposed copper containing solution to form substantially elemental copper on the surface of the silicon or the the material containing the silicon.

* * * * *